(12) United States Patent
Chuang et al.

(10) Patent No.: US 11,877,416 B2
(45) Date of Patent: Jan. 16, 2024

(54) RISER CARDS WITH INLINE SLOTS

(71) Applicant: HEWLETT-PACKARD DEVELOPMENT COMPANY, L.P., Spring, TX (US)

(72) Inventors: Yu Lih Chuang, Taipei (TW); Yen-Tang Chang, Taipei (TW); Heather Louise Burnam Volesky, Fort Collins, CO (US); Jonathan D. Bassett, Fort Collins, CO (US); Wen Bin Lin, Taipei (TW); Chao-Wen Cheng, Taipei (TW)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 136 days.

(21) Appl. No.: 17/583,328

(22) Filed: Jan. 25, 2022

(65) Prior Publication Data
US 2023/0240036 A1 Jul. 27, 2023

(51) Int. Cl.
*H05K 7/14* (2006.01)
*G06F 13/42* (2006.01)
*H05K 1/14* (2006.01)
*H05K 3/36* (2006.01)

(52) U.S. Cl.
CPC ....... *H05K 7/1444* (2013.01); *G06F 13/4226* (2013.01); *H05K 7/1418* (2013.01); *G06F 2213/0024* (2013.01); *G06F 2213/0026* (2013.01); *H05K 1/141* (2013.01)

(58) Field of Classification Search
CPC ................................. G06F 13/12; G06F 1/185
See application file for complete search history.

(56) References Cited

U.S. PATENT DOCUMENTS

| | | | |
|---|---|---|---|
| 2002/0072255 A1* | 6/2002 | Leman | H01R 12/721 439/61 |
| 2008/0100994 A1* | 5/2008 | Fan | G06F 1/185 361/679.02 |
| 2011/0197005 A1* | 8/2011 | Liao | G06F 13/409 710/301 |
| 2012/0246371 A1* | 9/2012 | Fu | G01R 31/2808 710/301 |
| 2014/0133085 A1* | 5/2014 | Lin | G06F 1/185 361/679.32 |
| 2016/0070661 A1* | 3/2016 | Huang | G06F 13/12 710/33 |
| 2017/0019326 A1* | 1/2017 | Patel | H04L 45/18 |
| 2017/0258372 A1* | 9/2017 | Chu | A61B 5/117 |

* cited by examiner

*Primary Examiner* — Getente A Yimer
(74) *Attorney, Agent, or Firm* — Knobbe, Martens, Olson & Bear, LLP

(57) ABSTRACT

In example implementations, an apparatus is provided. The apparatus includes a riser card body, a first interface, a first 2×8 slot on a surface of the riser card body, and a second 2×8 slot on a same side of the surface of the riser card body as the first 2×8 slot. The first interface includes a first set of fingers and a second set of fingers at an end of the riser card body to connect to a peripheral component interconnect express (PCIe) slot of a motherboard. The first 2×8 slot and the second 2×8 slot are positioned perpendicular to the PCIe slot of the motherboard.

14 Claims, 7 Drawing Sheets

500

| | |
|---|---|
| HPGP_PCIEPWR_EN2 | RISER_DET# |
| GND | GND |
| PCIE_R_SDA_2 | NA |
| PCIE_R_SCL_2 | SLOT2_PRESENT_OD(Redriver) |
| GND | GND |
| +3.3V_MAIN | +3.3V_MAIN |
| +3.3V_AUX_PCIE(Redirver) | +3.3V_MAIN |
| +3.3V_AUX_PCIE(Redirver) | GND |
| GND | PCIE_R_RST2# |
| WAKE2# | GND |
| CLKREQ2# | PCIE_R_CLKP2 |
| GND | PCIE_R_CLKN2 |
| RISER_DET# | GND |

|  |  |
|---|---|
| +12V_PCIE2 | SLOT2_PRESENT_OD(Redriver) |
| +12V_PCIE2 | +12V_PCIE2 |
| +12V_PCIE2 | +12V_PCIE2 |
| GND | GND |
| PCIE_R_SDA_2 | +3.3V_MAIN |
| PCIE_R_SCL_2 | +3.3V_MAIN |
| GND | +3.3V_MAIN |
| +3.3V_AUX_PCIE (Redriver) | GND |
| +3.3V_AUX_PCIE (Redriver) | GND |

FIG. 6

RISER CARDS WITH INLINE SLOTS

BACKGROUND

Computing devices can be used to execute various applications and programs. A processor is deployed in a computing device to execute the applications and programs. The computing device can have additional components and modules (e.g., memory modules, wireless radios, graphical processors, and the like) that help with the execution of various tasks and/or applications.

Some of the additional components may be deployed as add-in-cards. The add-in-cards can be connected to peripheral component interconnect express (PCIe) slots on the motherboard. The add-in-cards are inserted in a particular direction that can be used in large desktop tower designs.

BRIEF DESCRIPTION OF THE DRAWINGS

FIG. 5 illustrates an example of a 26 pin configuration of an inline riser card;

FIG. 6 illustrates an example 20 pin configuration of an example inline riser card of the present disclosure.

DETAILED DESCRIPTION

Examples described herein provide a riser card with inline slots. As discussed above, computing devices can have additional components that are installed as add-in-cards to PCIe slots on the motherboard. However, the PCIe slots can be located relatively close together and may make it difficult for other add-in-cards (e.g., multiple discrete graphics cards) to be installed in the PCIe slots.

In addition, desktop computer designs are becoming smaller and their profiles are becoming lower. As a result, installing add-in-cards on their sides in the PCIe slots can increase the overall profile of the desktop computer.

Currently, riser cards may be available to reorient the add-in-cards to a lower profile position. The riser cards can be inserted into the PCIe slot and allow the add-in-cards to be positioned horizontally. However, the current riser cards provide a one-to-one conversion of the PCIe slot. In other words, the riser card is also a 1×16 connection similar to the PCIe slot. In addition, current riser cards may include many redundant pins that are unneeded.

The present disclosure provides a riser card with two 8 pin inline slots that can be configured to operate in a 2×8 or 1×16 configuration. The riser card may include communication protocols that instruct the controller on the motherboard of a computing device a current configuration of the riser card. For example, the riser card can operate with a single card in a first slot, a single card in a second slot, or two cards in both slots (e.g., one card in each slot). Thus, the riser card of the present disclosure may provide additional flexibility in the number of add-in-cards that can be used by a single riser card.

In addition, the riser card of the present disclosure removes redundant pins and removes connections for external power cables. For example, certain form factors of add-in-cards (e.g., PCIe card electromechanical (CEM) form-factors) may not use the same pin signals as standard PCIe slots). Thus, these additional pins can be removed.

Some of the pins can be diverted for different functionality. For example, current motherboards may have multiple PCIe slots that each receive a certain amount of power. However, with the riser card, a single PCIe slot may be used, and the unused power from the other PCIe slots may be diverted to the riser card to power the riser card. As a result, external power connections and circuitry on the riser card can be removed. Thus, the riser card of the present disclosure may have fewer pins and may be cheaper and easier to fabricate without the external power connections and associated circuitry of previous riser cards.

Figure 1:
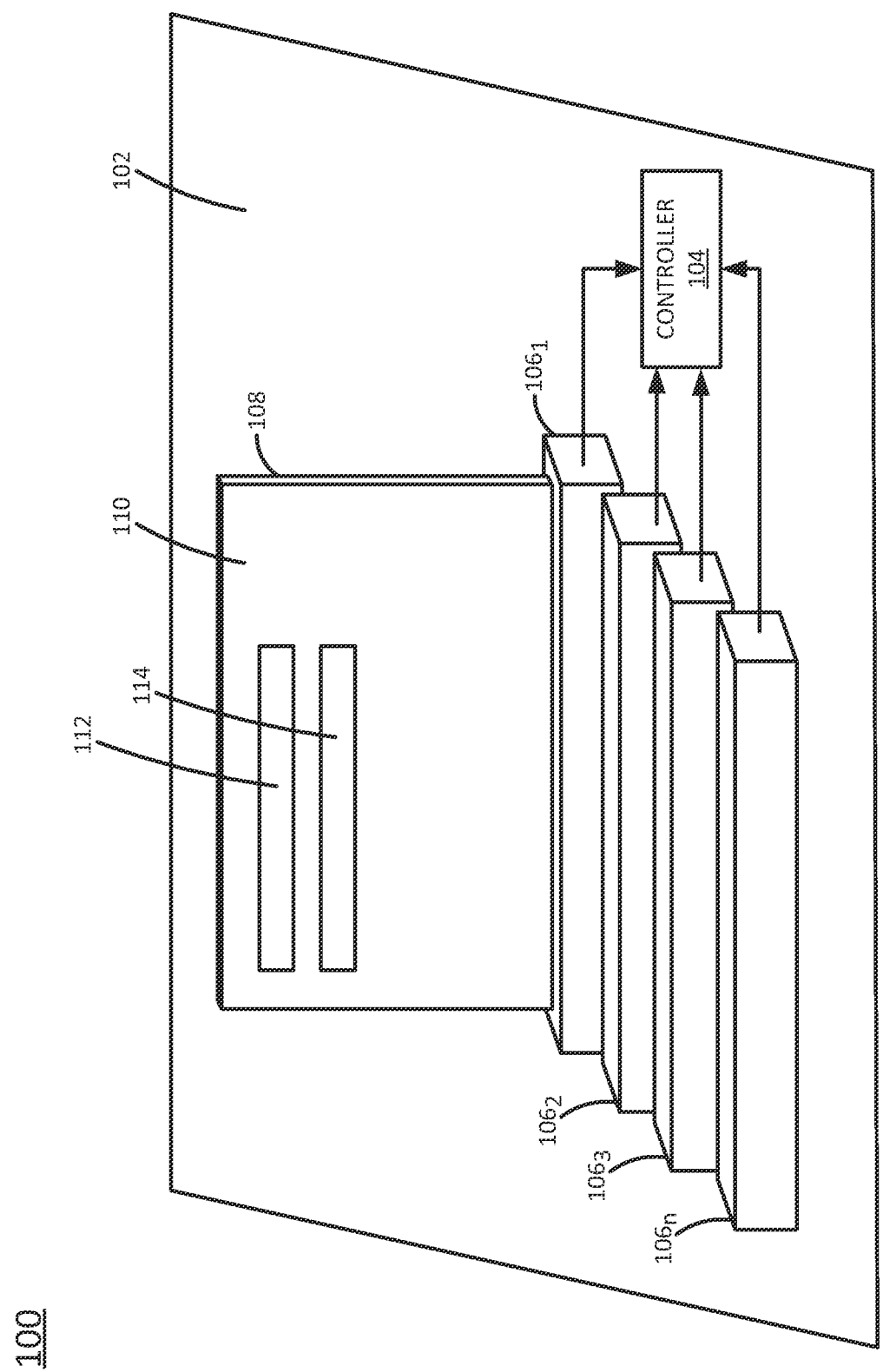
FIG. 1 is a block diagram of an example an apparatus with an inline riser card of the present disclosure.

FIG. 1 illustrates an example apparatus 100 of the present disclosure. In an example, the apparatus 100 may be a computing device or computing system. For example, the apparatus 100 may be a desktop computer, a laptop computer, a tablet computer, and the like.

It should be noted that apparatus 100 has been simplified for ease of explanation. Although various example components are illustrated in FIG. 1, it should be noted that the apparatus 100 may include additional components that are not shown. For example, the apparatus 100 may include input/output devices (e.g., a display, a monitor, a keyboard, a mouse, a trackpad, and the like), a power supply, various interfaces (e.g., a universal serial bus (USB) interface), communications interfaces (e.g., a wired or wireless communication interface such as WiFi, Ethernet, and the like), and so forth.

In an example, the apparatus 100 may include a printed circuit board (PCB) 102 that includes a controller 104, a plurality of peripheral component interconnect express (PCIe) slots 106$_1$-106$_4$ (hereinafter also referred to individually as a PCIe slot 106 or collectively as PCIe slots 106), and an inline riser card 108. The controller 104 may be communicatively coupled to the PCIe slots 106.

In an example, the controller 104 may include multiple controllers that operate with the PCIe slots 106. For example, the controller 104 may be a platform controller hub (PCH) and an embedded controller. However, the controllers are consolidated into a single controller 104 for ease of explanation in FIG. 1. The controller 104 may transmit various operational and control signals to the PCIe slots 106.

In addition, the controller 104 may transmit various control signals to a first slot 112 and a second slot 114 of the inline riser card 108, as discussed in further details below. For example, the controller 104 may determine which slots are active to configure how data is transmitted to the first slot 112 and/or the second slot 114, to divert power from unused PCIe slots to eliminate the use of an external power source on the inline riser card 108, to avoid address conflicts between the first slot 112 and the second slot 114 when both slots are active, and the like.

In an example, the inline riser card may 108 may include a riser card body 110. The riser card body 110 may include the first slot 112 and the second slot 114. The first slot 112 and the second slot 114 may be aligned over one another or aligned vertically on a same side of the riser card body 110.

The riser card body 110 may be inserted vertically into one of the PCIe slots 106 to allow additional add-in-cards to be connected horizontally (e.g., parallel with the PCB 102) inside of a housing of the apparatus 100. In other words, the first slot 112 and the second slot 114 may have slot openings that are perpendicular to the slot openings in the PCIe slots 106. The riser card body 110 may include connection interfaces to connect to the PCIe slots 106, as discussed in further details below.

The inline riser card 108 of the present disclosure may deploy two separate 2×8 data lane slots instead of a single 1×16 data lane slot provided by the PCIe slots 106. For example, the first slot 112 may be a 2×8 data lane slot, and the second slot 114 may be a 2×8 data lane slot. Thus, the inline riser card 108 of the present disclosure may provide additional flexibility in allowing multiple add-in-cards to be connected to the inline riser card 108. As discussed below, the controller 104 may be modified to provide control signals to prevent conflicts when both slots 112 and 114 are active with a connected add-in-card.

In addition, the inline riser card 108 may be powered with an external power supply or may be reconfigured to be powered via diverted power from the unused PCIe slots 106. As discussed in further details below, redundant pins of the connection interface on the inline riser card 108 may be reassigned to receive power from the unused PCIe slots. As a result, the inline riser card 108 may be fabricated without an external power connection and associated circuitry. This may allow the inline riser card 108 to be fabricated at a lower cost and more quickly by removing the external power connection interfaces and associated circuitry.

Figure 2:
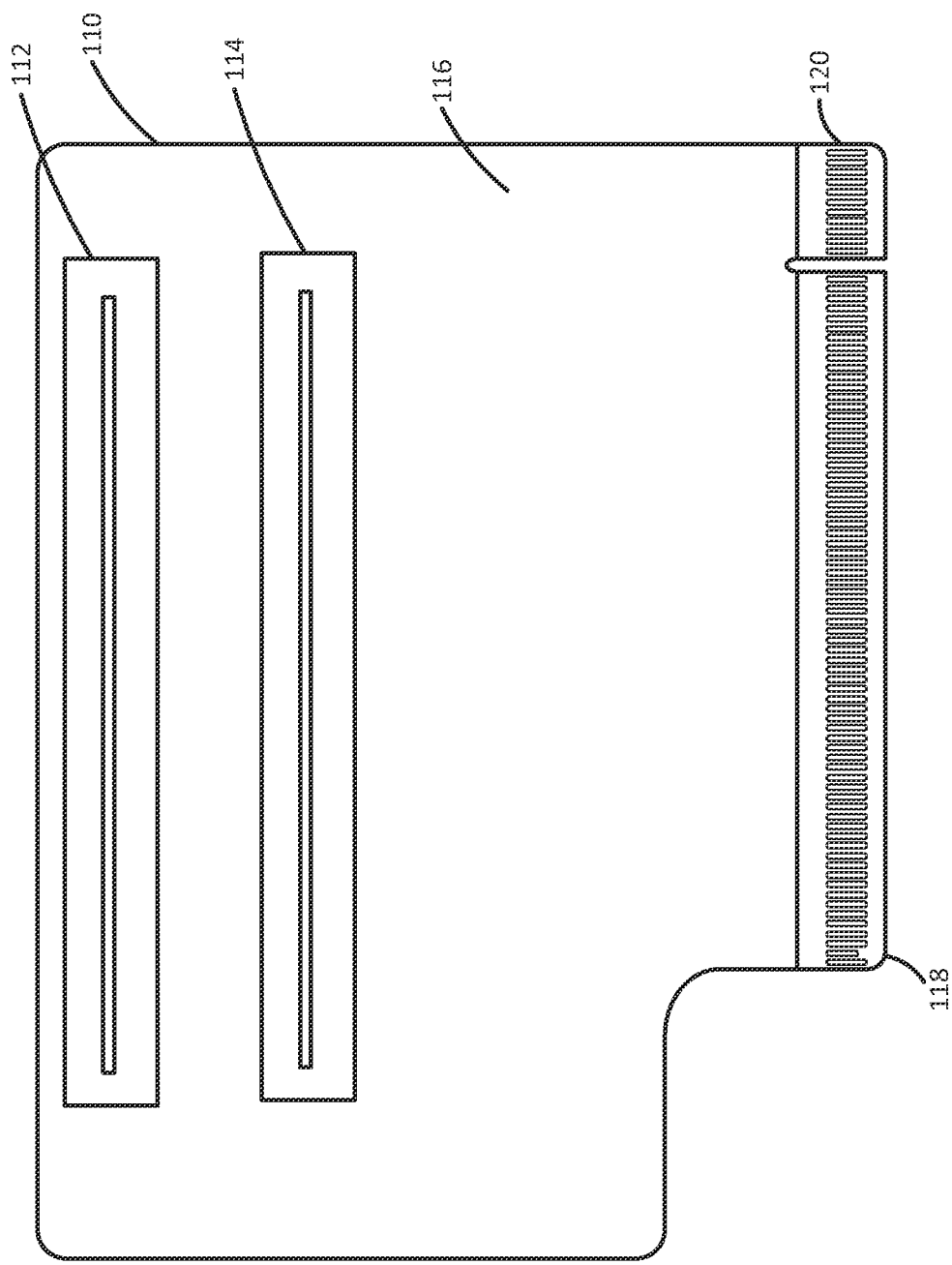
FIG. 2 is a block diagram of an example inline riser card of the present disclosure.

FIG. 2 illustrates a block diagram of an example inline riser card 108 without an external power connection interface. The inline riser card 108 may be similar to the inline riser card 108 illustrated in FIG. 1. In an example, the inline riser card 108 may include a riser card body 110. The riser card body 110 may be fabricated from a PCB material.

In an example, the inline riser card 108 may include a first slot 112 and a second slot 114. The first slot 112 and the second slot 114 may be located on a same side 116 of the riser card body 110. As noted above, the first slot 112 and the second slot 114 may be deployed as separate 2×8 data lane slots that can each receive a respective add-in-card. The add-in-cards may include memory modules, discrete graphics cards/processors, and the like.

In an example, the inline riser card 108 may include a connection interface that includes a first set of fingers 118 and a second set of fingers 120. As discussed in further details below, the first set of fingers 118 may be used to provide power and communication signals to the first slot 112. The second set of fingers 120 may be used to provide power and communication signals to the second slot 114.

Figure 3:
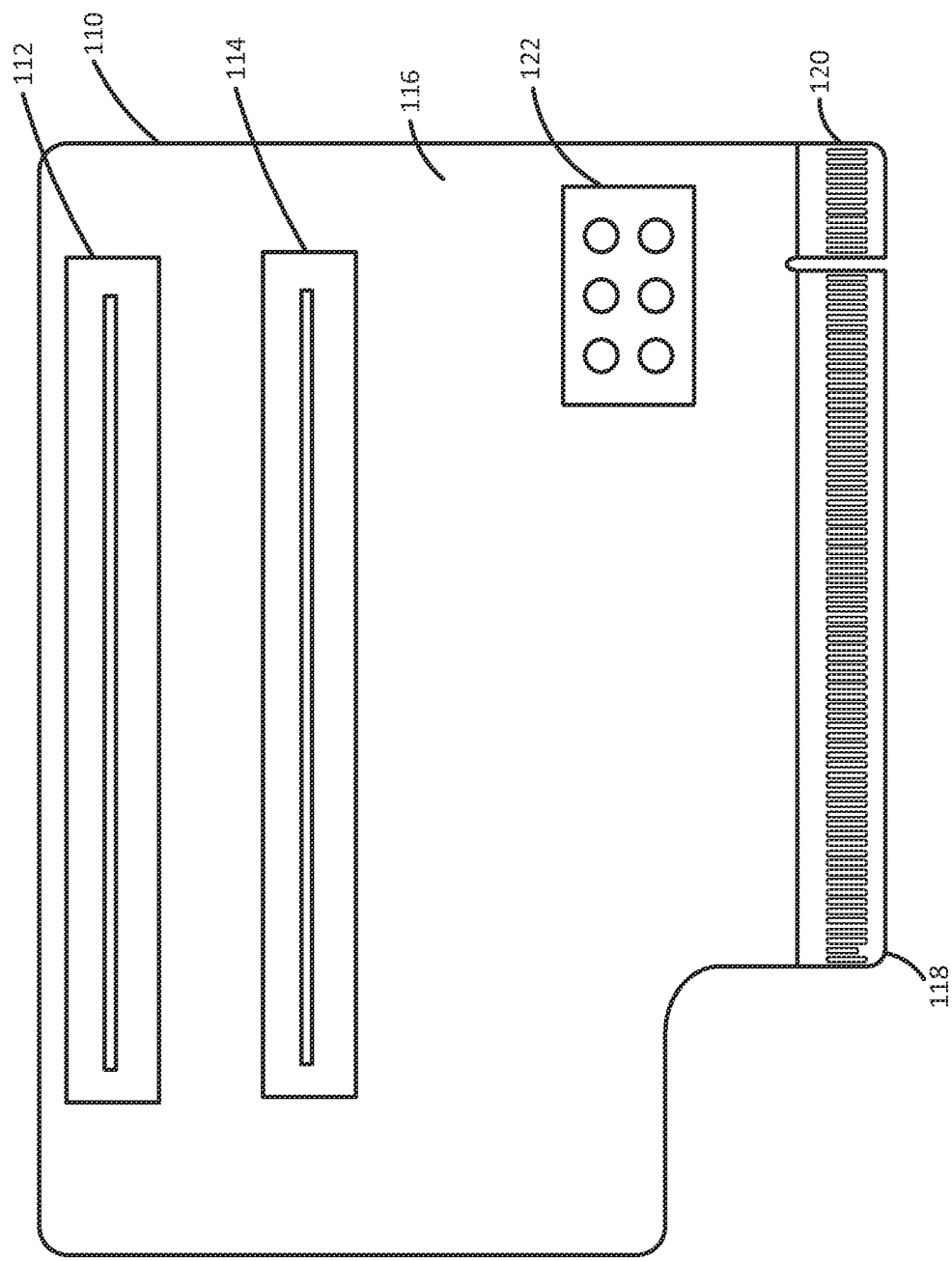
FIG. 3 is a block diagram of another example inline riser card of the present disclosure.

FIG. 3 illustrates a block diagram of another example inline riser card 300. The inline riser card 300 may be similar to the inline riser card 108. For example, the inline riser card 300 may include a riser card body 110 that includes a first slot 112 and a second slot 114 on a same side 116 of the riser card body 110. The first slot 112 and the second slot 114 may also be 2×8 data lane slots. In addition, the inline riser card 300 may include a first set of fingers 118 and a second set of fingers 120 to connect to a PCIe slot 106.

However, the inline riser card 300 may include an external power connection interface 122. The external power connection interface 122 may be a six pin interface that can connect to an external power supply on the motherboard or the PCB 102. For example, the PCB 102 may have a 550 Watt (W) external power supply unit that can provide power to the inline riser card 300 via the external power connection interface 122. The power may be provided to power the add-in-cards connected to the first slot 112 or the second slot 114.

However, as noted above, the pin configuration of the inline riser card 108 may be reconfigured to divert power from the unused PCIe slots 106 to the inline riser card 108. For example, the PCB 102 may include four PCIe slots 106. The inline riser card 108 may be connected to the first PCIe slot 106. The second, third, and fourth PCIe slots 106 may remain empty. The power normally delivered from the PCB 102 to the second, third, and fourth PCIe slots 106 may be diverted to the inline riser card 108 using a pin configuration discussed below, and illustrated in table 600 of FIG. 6.

For example, the second, third, and fourth PCIe slots 106 may normally receive 25 Watts, 75 Watts, and 10 Watts of power, respectively. However, since the second, third, and fourth PCIe slots 106 are not being used when the inline riser card 108 is connected to the first PCIe slot 106, the unused power can be diverted. Thus, the inline riser card 108 can eliminate the external power connection interface 122 and the associated circuitry.

Figure 4:
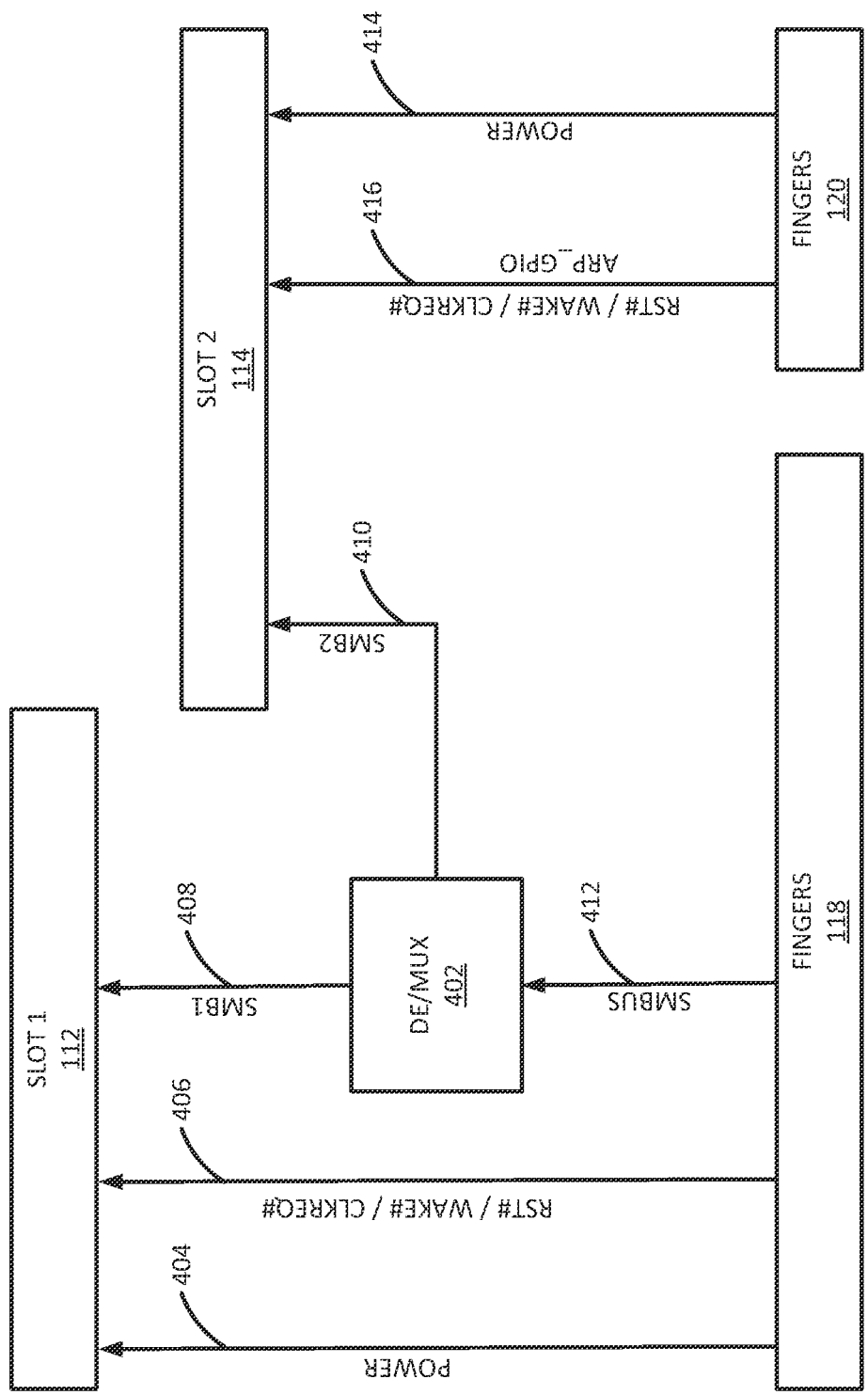
FIG. 4 is an example circuit diagram of communications signals exchanged between the fingers and slots of the inline riser card.

FIG. 4 illustrates an example circuit diagram 400 of communication signals that can be exchanged between the first set of fingers 118 and the second set of fingers 120 and the first slot 112 and the second slot 114. It should be noted that the circuit diagram 400 has been simplified for ease of explanation and may include additional components that are not shown. For example, the circuit diagram 400 may also include a redriver, clock buffers, a thermal sensor, additional gates to combine multiple signals, a field effect transistor (FET) inverter, additional resistors, and the like.

In an example, the communication signaling may be based on a configuration of the inline riser card 108 or 300. For example, an additional first slot present signal and a second slot present signal may be used by the slot 114 to let the controller 104 know when an add-in-card slot is connected. For example, the controller 104 may operate in one of five different configurations based on the presence of the first slot and/or second slot present signals. The first configuration may be when the inline riser card 108 or 300 is not detected. The controller 104 may operate the PCIe slots 106 in a default 1×16 data lane configuration.

A second configuration may be when the inline riser card 108 or 300 is installed into a PCIe slot 106, but no add-in-cards are detected. The controller 104 may operate the PCIe slots 106 in a default 1×16 data lane configuration with 2×8 data lanes passing through the first slot 112.

A third configuration may be when the inline riser card 108 or 300 is installed with two add-in-cards installed. In other words, the first slot 112 has a first connected add-in-card and the second slot 114 has a second connected add-in-card. The controller 104 may operate the PCIe express slot 106 as two 2×8 data lanes. A first set of 2×8 data lanes may be assigned to the first slot 112 and a second set of 2×8 data lanes may be assigned to the second slot 114.

A fourth configuration may be when the inline riser card 108 or 300 is installed with an add-in-card connected to the first slot 112 (e.g., no card in the second slot 114). The controller 104 may operate the PCIe slot 106 in a 1×16 data lane configuration with 2×8 data lanes assigned to the first slot 112.

A fifth configuration may be when the inline riser card 108 or 300 is installed with an add-in-card connected to the second slot 114 (e.g., no card in the first slot 112). The controller 104 may operate the PCIe slot 106 as two 2×8 data lanes. A set of the 2×8 data lanes may be assigned to the second slot 114.

As shown in FIG. 4, the first set of fingers 118 may provide power via a power channel 404 to the first slot 112. The first set of fingers 118 may also send a restart signal (RST #), a wake signal (WAKE #), and a clock request (CLKREQ #) via a channel 406 to the first slot 112.

The second set of fingers 120 may provide power via a power channel 414 to the second slot 114. In an example, an additional gate may be provided when an external power supply is used. For example, the example circuit diagram 400 may illustrate an example without the external power connection interface 122. In an example, the second set of fingers 120 may also send a restart signal (RST #), a wake signal (WAKE #), and a clock request (CLKREQ #) via a channel 414 to the second slot 114.

In an example, the inline riser card 108 may also include a demultiplexer/multiplexer (DE/MUX) 402. The DE/MUX 402 may be able to direct system management bus (SMBUS) signals from the controller 104 to either the first slot 112 via a channel 408 or to the second slot 114 via a channel 410.

In an example, the controller 104 and the inline riser card 108 or 300 may also exchange an address resolution protocol general purpose input/output signal (ARP_GPIO) via the channel 416. The ARP_GPIO signal may prevent address conflicts when two identical add-in-cards are connected to the first slot 112 and the second slot 114.

For example, in some instances a user may install two identical graphics cards into the first slot 112 and the second slot 114. Without the ARP_GPIO signal, address conflicts may arise when the controller 104 attempts to send control signals to one of the graphics cards via the SMBUS signals (e.g., the channels 408 and 410).

In an example, the ARP_GPIO signal may instruct the inline riser card 108 or 300 which slot a read/write signal or SMBUS control signal is directed to. For example, when the ARP_GPIO signal is low (e.g., 0) the read/write signal or control signal may be directed to the add-in-card connected to the first slot 112. When the ARP_GPIO is high (e.g., 1) the read/write signal or control signal may be directed to the add-in-card connected to the second slot 114. Thus, the ARP_GPIO signal may prevent address conflicts when identical add-in-cards are connected to the first slot 112 and the second slot 114.

As discussed above, some inline riser cards may include a 26 pin configuration. For example, the inline riser card 300 with the external power connection interface 122 may include a 26 pin configuration. FIG. 5 illustrates a table 500 that illustrates an example 26 pin configuration with the various signals that can be assigned to each one of the 26 pins.

However, some of the pin assignments may be redundant for certain connection interfaces. For example, the first set of fingers 118 of the inline riser card 108 may be a golden finger referred to as J3. The second set of fingers 120 is a J4 extended golden finger interface. The J4 extended golden finger interface provides support for additional power and sideband signals. Thus, some of the sideband signals in the 26 pin configuration may be redundant. The redundant pins can be re-assigned to a lesser pin configuration, and the pin count can be reduced to under 20 pins without the external power connection interface 122.

In addition, some of the pins associated with the second set of fingers 120 (e.g., the J4 pin assignments) can be reassigned to divert power from the unused PCIe slots 106. For example, up to 75 W of power can be diverted from the unused PCIe slots 106 to the inline riser card 108 to power the add-in-cards connected to the first slot 112 and the second slot 114.

The table 500 in FIG. 5 lists some of the redundant signals that may be found in the J4 pin assignments. In some instances, some pin assignments can be redundant, as the same signals can be provided by the pin assignments for the first set of fingers 118 (e.g., the J3 pin assignments).

The redundant signals may include the HPGP_PCIEPWR_EN2 signal, the WAKE2 # signal, the CLKREQ2 # signal, the two RISER DET # signals, the PCIE_R_RST2 # signal, and the N/A signal. For example, the HPGP_PCIEPOWR_EN2 signal maybe a self-define signal that is not needed for some PCIe protocols, such as PCIe CEM. CLKREQ2 # may also be optional for PCIe CEM. The WAKE2 # signal can be redundant, as the PCIe CEM card can have a J3 component to import the wake signal. The J3 component in the PCIe CEM card can also make the PCIE_R_RST2 # signal and the two RISER DET # signals redundant. Lastly, the NA signal is a redundancy pin assignment that can be removed.

FIG. 6 illustrates a table 600 that illustrates an example of a 20 pin configuration of the second set of fingers 120 (e.g., the J4 pin assignments) that can be used for the inline riser card 108. For example, the redundant signals from table 500 have been removed in the table 600. In addition, one of the RISER_DET # signals, the PCIE_R_CLKP2, the PCIE_R_CLKN2 and three of the ground (GND) pin assignments can be reassigned to +12V_PICE2 signals to divert power from the unused PCIe slots 106 to the inline riser card 108. As a result, the external power connection interface 122 of the inline riser card 300 is not needed for the inline riser card 108.

The 20 pin configuration may provide a cheaper design as fewer pin assignments are used compared to the 26 pin configuration. In addition, elimination of the external power connection interface 122 and associated circuitry may reduce cost and complexity in fabricating the inline riser card 108.

Figure 7:
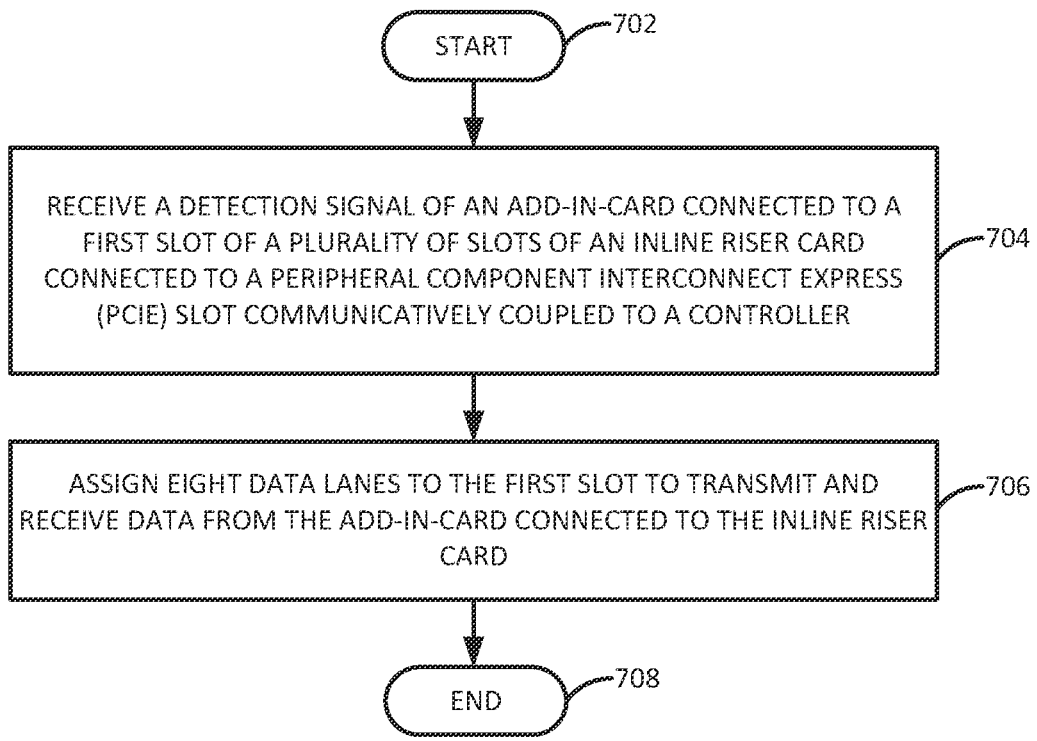
FIG. 7 is a flow chart of an example method to assign data lanes to a slot of the inline riser card.

FIG. 7 illustrates a flow diagram of an example method 700 for assigning data lanes to a slot of the inline riser card of the present disclosure. In an example, the method 700 may be performed by the apparatus 100 illustrated in FIG. 1, or the line riser cards 108 or 300 illustrated in FIG. 3.

At block 702, the method 700 begins. At block 704, the method 700 receives a detection signal of an add-in-card connected to a first slot of a plurality of slots of an inline riser card connected to a peripheral component interconnect express (PCIe) slot communicatively coupled to the controller. For example, a connection status of each slot may be detected based on a connection signal transmitted to the PCH over the SMBus of the PCIe interface. If any add-in-cards are connected to the first slot or the second slot of the inline riser card, the PCH may receive a detection signal via the SMBus.

As noted above, the PCH may configure the 1×16 data lanes of the PCIe slot in a variety of different ways based on the connection signal that is detected. For example, the different configurations may be assigned for when no inline riser card is detected, when the inline riser card is detected with no add-in-cards connected, when the inline riser card is detected with add-in-cards connected to both slots, when the inline riser card is detected with an add-in-card detected in the first slot, or when the inline riser card is detected with an add-in-card detected in the second slot.

At block 706, the method 700 assigns eight data lanes to the first slot to transmit and receive data from the add-in-card connected to the inline riser card. For example, the PCH may detect that an add-in-card is detected in the first slot of the connected inline riser card. As a result, the PCH may assign eight data lanes of the 16 data lanes to the first slot.

At a later time, the PCH may receive a detection signal indicating that a second add-in-card is connected to a second slot of the plurality of slots. As a result, the PCH may assign an additional eight data lanes (e.g., the remaining eight unused data lanes of the 16 data lanes) to the second slot to transmit data to and receive data from the second add-in-card connected to the inline riser card.

In an example, when two identical add-in-cards are connected to the inline riser card (e.g., two identical graphics cards), an ARP_GPIO signal can be used to prevent address conflicts. For example, the ARP_GPIO may indicate which slot should receive the control signal (e.g., ARP_GPIO low may go to the first slot or ARP_GPIO signal high may go to the second slot).

In an example, the PCH or controller may deliver power to the inline riser card to power the add-in-cards via pins on the connection interface of the inline riser card assigned to receive power diverted from the unused PCIe slots. For example, the 20 pin configuration illustrated in the table 600 can be used to deliver power to the inline riser card. As noted above, the external power connection interface can be removed when using the 20 pin configuration illustrated in the table 600. At block 708, the method 700 ends.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. An apparatus, comprising:
    a riser card body;
    a first interface with a first set of fingers and a second set of fingers at an end of the riser card body to connect to a peripheral component interconnect express (PCIe) slot of a motherboard, wherein the second set of fingers comprises a twenty pin assignment configuration, wherein at least one pin of the twenty pin assignment configuration is assigned to divert power from an unused PCIe slot to an accessory connected to the riser card body, and wherein the riser card body is powered by the at least one pin of the twenty pin assignment configuration without an external power source;
    a first 2×8 slot on a surface of the riser card body; and
    a second 2×8 slot on a same side of the surface of the riser card body as the first 2×8 slot, wherein the first 2×8 slot and the second 2×8 slot are positioned perpendicular to the PCIe slot of the motherboard.

2. The apparatus of claim 1, wherein the first 2×8 slot is controlled via signals transmitted by the first set of fingers of the first interface.

3. The apparatus of claim 1, wherein the second 2×8 slot is controlled via signals transmitted by the second set of fingers of the first interface.

4. The apparatus of claim 1, further comprising:
    a power connection interface to receive power from an external power source.

5. The apparatus of claim 1, further comprising:
    a demultiplexer to divert communication signals from the first interface to either the first 2×8 slot or the second 2×8 slot.

6. An apparatus, comprising:
    a motherboard comprising a plurality of peripheral component interconnect express (PCIe) slots;
    a controller communicatively coupled to the motherboard and to the plurality of PCIe slots;
    an inline riser card coupled to a PCIe slot of the plurality of PCIe slots, wherein the inline riser card comprises:
        a riser card body;
        a first interface with a first set of fingers and a second set of fingers at an end of the riser card body to connect to the PCIe slot, wherein the second set of fingers comprises a twenty pin assignment configuration, wherein at least one pin of the twenty pin assignment configuration is assigned to divert power from an unused PCIe slot to an accessory connected to the riser card body, and wherein the riser card body is powered by the at least one pin of the twenty pin assignment configuration without an external power source;
        a first slot on a surface of the riser card body; and
        a second slot on a same side of the surface of the riser card body as the first slot, wherein the first slot and the second slot are positioned perpendicular to the plurality of PCIe slots of the motherboard.

7. The apparatus of claim 6, wherein the at least one pin comprises five pins to divert up to 75 Watts of power from the unused PCIe slot.

8. The apparatus of claim 7, wherein the riser card body is free from an external power connection interface.

9. The apparatus of claim 6, wherein each PCIe slot of the plurality of PCIe slots is a 1×16 slot, and the first slot and the second slot of the inline riser card are 2×8 slots.

10. The apparatus of claim 6 wherein the first slot is controlled via a wake signal and a general purpose input/output signal from the first set of fingers of the first interface.

11. The apparatus of claim 6, wherein the second slot is controlled via a wake signal and a general purpose input/output signal from the second set of fingers of the first interface.

12. The apparatus of claim 6, wherein the first slot and the second slot of the inline riser card are aligned vertically on the riser card body.

13. A method comprising:
    receiving, by a controller, a detection signal of an add-in-card connected to a first slot of a plurality of slots of an inline riser card connected to a peripheral component interconnect express (PCIe) slot communicatively coupled to the controller, wherein the inline riser card comprises a first set of fingers and a second set of fingers, wherein the second set of fingers comprises a twenty pin assignment configuration;
    assigning, by the controller, at least one pin of the twenty pin assignment configuration to divert power from an unused PCIe slot to the add-in-card connected to the first slot;
    powering the add-in-card by the at least one pin of the twenty pin assignment configuration without an external power source; and
    assigning, by the controller, eight data lanes to the first slot to transmit data to and receive data from the add-in-card connected to the inline riser card.

14. The method of claim 13, further comprising:
    receiving, by the controller, a second detection signal of a second add-in-card connected to a second slot of the plurality of slots of the inline riser card; and
    assigning, by the controller, an additional eight data lanes to the second slot to transmit data to and receive data from the second add-in-card connected to the inline riser card.

* * * * *